(12) United States Patent
Sasaki et al.

(10) Patent No.: US 8,408,234 B2
(45) Date of Patent: Apr. 2, 2013

(54) PROCESS LIQUID SUPPLY SYSTEM, PROCESS LIQUID SUPPLY METHOD, AND STORAGE MEDIUM

(75) Inventors: Keisuke Sasaki, Tosu (JP); Kazuyoshi Eshima, Tosu (JP)

(73) Assignee: Tokyo Electron Limited, Minato-Ku, Tokyo-To (JP)

( * ) Notice: Subject to any disclaimer, the term of this patent is extended or adjusted under 35 U.S.C. 154(b) by 1340 days.

(21) Appl. No.: 11/723,197

(22) Filed: Mar. 16, 2007

(65) Prior Publication Data

US 2007/0221271 A1 Sep. 27, 2007

(30) Foreign Application Priority Data

Mar. 22, 2006 (JP) .................................. 2006-078010

(51) Int. Cl.
*B67D 7/72* (2010.01)
(52) U.S. Cl. ......................................... 137/209; 137/391
(58) Field of Classification Search .................... 137/12, 137/206, 209, 211.5, 391, 395
See application file for complete search history.

(56) References Cited

U.S. PATENT DOCUMENTS

| | | | |
|---|---|---|---|
| 5,330,072 A * | 7/1994 | Ferri et al. | 222/1 |
| 5,417,346 A * | 5/1995 | Ferri et al. | 222/61 |
| 6,383,291 B1 | 5/2002 | Konishi | |

FOREIGN PATENT DOCUMENTS

| | | |
|---|---|---|
| JP | 10-154684 | 6/1998 |
| JP | 2001-157833 | 6/2001 |
| WO | WO 91/17897 | 11/1991 |

OTHER PUBLICATIONS

Machine trasnlation for Japanese Document No. 10-154684.*
Extended European Search Report dated Aug. 23, 2007 issued for counterpart Appln. No. EP 07 00 5571.

\* cited by examiner

*Primary Examiner* — Craig Schneider
(74) *Attorney, Agent, or Firm* — Smith, Gambrell & Russell, LLP

(57) ABSTRACT

A process liquid supply system includes a pure water supply source connected to a process vessel through a supply pipe; a chemical liquid tank that stores a chemical liquid and supplies the chemical liquid stored therein to the supply pipe; and a compressed gas supply source connected to the chemical liquid tank through a compressed gas supply pipe. A pressure adjusting part is disposed on the compressed gas supply pipe at a position between the compressed gas supply source and the chemical liquid tank. The pressure adjusting part is controlled so that the pressure of the compressed gas supplied from the compressed gas supply source to the chemical liquid tank is gradually or stepwise increased after the supply of the chemical liquid from the chemical liquid tank to the supply pipe is started so that the concentration of the processing liquid remains at desired level.

19 Claims, 4 Drawing Sheets

PROCESS LIQUID SUPPLY SYSTEM, PROCESS LIQUID SUPPLY METHOD, AND STORAGE MEDIUM

FIELD OF THE INVENTION

The present invention relates to a process liquid supply system and a process liquid supply method for supplying to a process vessel a process liquid formed by diluting a chemical liquid with a pure water, and to a storage medium storing a program for controlling the process liquid supply system to accomplish the process liquid supply method.

BACKGROUND OF THE INVENTION

When semiconductor parts, flat display panels, and electronic components are manufactured, a substrate process system has been conventionally used for cleaning and etching objects to be processed, such as semiconductor wafers, liquid crystal substrates, and disc-shaped storage mediums, with the use of a process liquid.

The conventional substrate process system includes a process liquid supply system that supplies a process liquid formed by diluting a chemical liquid with a pure water to a process vessel, for processing an object to be processed. In the process liquid supply system, a chemical liquid pressurized by a compressed gas is diluted with a pure water to produce a process liquid of a predetermined concentration.

To be specific, in the conventional process liquid supply system, a pure water supply source is connected to the process vessel through a supply pipe. There is also disposed a chemical liquid tank that stores a chemical liquid, and supplies the chemical liquid stored therein to the supply pipe through a mixing valve. A compressed gas supply source is connected to the chemical liquid tank through a compressed gas supply pipe.

In the conventional process liquid supply system, the chemical liquid (e.g., hydrogen peroxide, ammonia, hydrochloric acid, or hydrogen fluoride) stored in the chemical liquid tank is supplied to the supply pipe by a predetermined pressure of the compressed gas (e.g., nitrogen gas) supplied from the compressed gas supply source. Inside the mixing valve, the chemical liquid is diluted with a pure water supplied form the pure water supply source at a predetermined concentration so as to produce a process liquid. The thus produced process liquid is supplied to the process vessel (see, for example, JP2001-157833A).

SUMMARY OF THE INVENTION

In the conventional process liquid supply system, the chemical liquid stored in the chemical liquid tank is pressed by the compressed gas of a predetermined pressure so as to be supplied to the mixing valve. Thus, a total pressure of a hydraulic pressure corresponding to a weight (water level) of the chemical liquid stored in the chemical liquid tank and the predetermined pressure of the compressed gas is exerted on the chemical liquid which is being supplied to the mixing valve.

When the chemical liquid in the chemical liquid tank is gradually decreased in accordance with the supply of the same to the mixing valve, the pressure acting on the chemical liquid supplied to the mixing valve is also gradually lowered in accordance with the supply of the chemical liquid. That is to say, when the pressure acting on the chemical liquid at a time point when the supply of the chemical liquid is started is compared to the pressure acting on the chemical liquid at a time point when the supply of the chemical liquid is terminated, the latter is smaller than the former by a water head pressure corresponding to the weight (water level) of the chemical liquid stored in the chemical liquid tank.

When the pressure acting on the chemical liquid supplied to the mixing valve is lowered as the chemical liquid is supplied thereto, an amount of the chemical liquid supplied to the mixing valve is undesirably decreased. Thus, a concentration of the process liquid obtained by diluting the chemical liquid with a pure water in the mixing valve is undesirably lowered. In this case, there is a possibility that the process liquid of a predetermined concentration cannot be constantly supplied to the process vessel.

The present invention has been made in view of this disadvantage. The object of the present invention is to provide a process liquid supply system, a process liquid supply method, and a storage medium for making it possible that a process liquid of a certain concentration can be constantly supplied to a process vessel, when a chemical liquid stored in a chemical liquid tank is gradually decreased by a supply of the chemical liquid from the chemical liquid tank.

The present invention is a process liquid supply system for supplying to a process vessel a process liquid formed by diluting a chemical liquid with a pure water, the process liquid supply system comprising: a pure water supply source connected to the process vessel through a supply pipe; a chemical liquid tank that stores a chemical liquid and supplies the chemical liquid stored therein to the supply pipe; a compressed gas supply source connected to the chemical liquid tank through a compressed gas supply pipe, the compressed gas supply source supplying a compressed gas to the chemical liquid tank to supply the chemical liquid from the chemical liquid tank to the supply pipe; a pressure adjusting part disposed on the compressed gas supply pipe at a position between the compressed gas supply source and the chemical liquid tank, the pressure adjusting part adjusting a pressure of the compressed gas supplied from the compressed gas supply source; and a control part that controls the pressure adjusting part in such a manner that a pressure of the compressed gas supplied from the compressed gas supply source to the chemical liquid tank is gradually or stepwise increased after a supply of the chemical liquid from the chemical liquid tank to the supply pipe is started.

In the process liquid supply system according to the present invention, it is preferable that the control part is configured to previously set, based on a height of a liquid level of the chemical liquid stored in the chemical liquid tank before the supply of the chemical liquid is started, an initial pressure which is a pressure of the compressed gas supplied from the compressed gas supply source to the chemical liquid tank immediately after the supply of the chemical liquid from the chemical liquid tank to the supply pipe is started.

In the process liquid supply system according to the present invention, it is preferable that the control part is configured to previously set, based on a ratio of the diluted chemical liquid relative to the process liquid, an initial pressure which is a pressure of the compressed gas supplied from the compressed gas supply source to the chemical liquid tank immediately after the supply of the chemical liquid form the chemical liquid tank to the supply pipe is started.

In the process liquid supply system according to the present invention, it is preferable that the control part controls the pressure adjusting part in such a manner that a pressure of the compressed gas supplied from the compressed gas supply source to the chemical liquid tank is gradually or stepwise increased, based on a supply period of the chemical liquid supplied from the chemical liquid tank to the supply pipe. In this case, it is particularly preferable that the control part controls the pressure adjusting part in such a manner that a pressure of the compressed gas supplied from the compressed gas supply source to the chemical liquid tank is increased by a predetermined amount, every time when the supply period of the chemical liquid from the chemical liquid tank to the supply pipe reaches an integral multiple of a previously set period.

In the process liquid supply system according to the present invention, it is preferable that the control part controls the pressure adjusting part in such a manner that a pressure of the compressed gas supplied from the compressed gas supply source to the chemical liquid tank is gradually or stepwise increased, based on a supply amount of the chemical liquid supplied from the chemical liquid tank to the supply pipe. In this case, it is particularly preferable that the control part controls the pressure adjusting part in such a manner that a pressure of the compressed gas supplied from the compressed gas supply source to the chemical liquid tank is increased by a predetermined amount, every time when the supply amount of the chemical liquid from the chemical liquid tank to the supply pipe reaches an integral multiple of a previously set amount.

In the process liquid supply system according to the present invention, it is preferable that the control part controls the pressure adjusting part in such a manner that a pressure of the compressed gas supplied from the compressed gas supply source to the chemical liquid tank is gradually or stepwise increased, based on both a supply period and a supply amount of the chemical liquid supplied from the chemical liquid tank to the supply pipe. In this case, it is particularly preferable that the control part controls the pressure adjusting part in such a manner that a pressure of the compressed gas supplied from the compressed gas supply source to the chemical liquid tank is increased by a predetermined amount, every time when the supply period of the chemical liquid from the chemical liquid tank to the supply pipe reaches an integral multiple of a previously set period, but when it is judged that the supply amount of the chemical liquid reaches an integral multiple of a previously set amount immediately before or after the certain supply period reaches an integral multiple of the previously set period, a timing for increasing a pressure of the compressed gas is temporarily changed, from a timing when the supply period of the chemical liquid reaches an integral multiple of the previously set period, to a timing when the supply amount of the chemical liquid reaches an integral multiple of the previously set amount.

The present invention is a process liquid supply method for supplying to a process vessel a process liquid formed by diluting a chemical liquid with a pure water, the process liquid supply method comprising the steps of: supplying a chemical liquid from a chemical liquid tank storing the chemical liquid to a supply pipe connected to a process vessel, by supplying a compressed gas to the chemical liquid tank; diluting the chemical liquid supplied from the chemical liquid tank to the supply pipe, by supplying a pure water to the supply pipe; and gradually or stepwise increasing a pressure of the compressed gas supplied to the chemical liquid tank, after the supply of the chemical liquid from the chemical liquid tank to the supply pipe is started.

In the process liquid supply method according to the present invention, it is preferable that an initial pressure, which is a pressure of the compressed gas supplied from the compressed gas supply source to the chemical liquid tank immediately after the supply of the chemical liquid from the chemical liquid tank to the supply pipe is started, is previously set based on a height of a liquid level of the chemical liquid stored in the chemical liquid tank before the supply of the chemical liquid is started.

In the process liquid supply method according to the present invention, it is preferable that an initial pressure, which is a pressure of the compressed gas supplied from the compressed gas supply source to the chemical liquid tank immediately after the supply of the chemical liquid from the chemical liquid tank to the supply pipe is started, is previously set based on the ratio of the diluted chemical liquid relative to the process liquid.

In the process liquid supply method according to the present invention, it is preferable that, in the step of gradually or stepwise increasing a pressure of the compressed gas supplied to the chemical liquid tank, a pressure of the compressed gas supplied from the compressed gas supply source to the chemical liquid tank is gradually or stepwise increased, based on a supply period of the chemical liquid supplied from the chemical liquid tank to the supply pipe. In this case, it is particularly preferable that a pressure of the compressed gas supplied from the compressed gas supply source to the chemical liquid tank is increased by a predetermined amount, every time when the supply period of the chemical liquid from the chemical liquid tank to the supply pipe reaches an integral multiple of a previously set period.

In the process liquid supply method according to the present invention, it is preferable that, in the step of gradually or stepwise increasing a pressure of the compressed gas supplied to the chemical liquid tank, a pressure of the compressed gas supplied from the compressed gas supply source to the chemical liquid tank is gradually or stepwise increased, based on a supply amount of the chemical liquid supplied from the chemical liquid tank to the supply pipe. In this case, it is particularly preferable that a pressure of the compressed gas supplied from the compressed gas supply source to the chemical liquid tank is increased by a predetermined amount, every time when the supply amount of the chemical liquid from the chemical liquid tank to the supply pipe reaches an integral multiple of a previously set amount.

In the process liquid supply method according to the present invention, it is preferable that, in the step of gradually or stepwise increasing a pressure of the compressed gas supplied to the chemical liquid tank, a pressure of the compressed gas supplied from the compressed gas supply source to the chemical liquid tank is gradually or stepwise increased, based on both a supply period and a supply amount of the chemical liquid supplied from the chemical liquid tank to the supply pipe. In this case, it is particularly preferable that a pressure of the compressed gas supplied from the compressed gas supply source to the chemical liquid tank is increased by a predetermined amount, every time when the supply period of the chemical liquid from the chemical liquid tank to the supply pipe reaches an integral multiple of a previously set period, but when it is judged that the supply amount of the chemical liquid reaches an integral multiple of a previously set rate immediately before or after the certain supply period reaches an integral multiple of the previously set period, a timing for increasing a pressure of the compressed gas is temporarily changed, from a timing when the supply period of the chemical liquid reaches an integral multiple of the previously set period, to a timing when the supply amount of the chemical liquid reaches an integral multiple of the previously set rate.

The present invention is a storage medium storing a program for controlling a process liquid supply system for supplying to a process vessel a process liquid formed by diluting a chemical liquid with a pure water to accomplish a process liquid supply method, the program comprising: a step of supplying a chemical liquid from a chemical liquid tank storing the chemical liquid to a supply pipe connected to a process vessel, by supplying a compressed gas to the chemical liquid tank; a step of diluting the chemical liquid supplied from the chemical liquid tank to the supply pipe, by supplying a pure water to the supply pipe; and a step of gradually or stepwise increasing a pressure of the compressed gas supplied to the chemical liquid tank, after the supply of the chemical liquid from the chemical liquid tank to the supply pipe is started.

The process liquid supply system, the process liquid supply method, and the storage medium according to the present invention can achieve the following effects.

That is to say, in the present invention, a pressure of the compressed gas is gradually or stepwise increased after the supply of the chemical liquid is started. Thus, even when the chemical liquid inside the chemical liquid tank is gradually decreased with the supply of the chemical liquid so that a pressure corresponding to a weight (liquid level) of the chemical liquid is lowered, a decrease in pressure acting on the chemical liquid supplied from the chemical liquid tank to the supply pipe can be restrained by increasing a pressure of the compressed gas. Therefore, lowering of a supply amount of the chemical liquid caused by a reduction in pressure can be prevented, and thus lowering of a concentration of a process liquid can be prevented.

An initial pressure of the compressed gas is previously set based on a height of a liquid level of the chemical liquid stored in the chemical liquid tank. Thus, even when the height of the liquid level of the chemical liquid differs depending on each of the chemical liquid tanks, a pressure acting on the chemical liquid can be substantially constantly maintained by changing an initial pressure of the compressed gas based on the height of the liquid level. Therefore, lowering of a supply amount of the chemical liquid caused by a reduction in pressure can be prevented, and thus lowering of a concentration of a process liquid can be prevented.

When an initial pressure of the compressed gas is previously set based on a concentration at which the chemical liquid is diluted with a pure water, it is unnecessary to dispose a channel (orifice, on-off valve, and so on) corresponding to a concentration of the diluted chemical liquid relative to a process liquid. Thus, the number of constituent parts can be decreased, which leads to a lower manufacturing cost and a simple maintenance operation.

Specifically, when a pressure of the compressed gas is increased based on a supply period of the chemical liquid from the chemical liquid tank, a concentration of the process liquid to be supplied to the process vessel can be prevented from lowering, without a provision of a pressure sensor.

Alternatively, when a pressure of the compressed gas is increased based on a supply amount of the chemical liquid from the chemical liquid tank, a concentration of the process liquid can be prevented from lowering, without a provision of a pressure sensor. Further, the process liquid of a desired amount can be precisely supplied.

Alternatively, when a pressure of the compressed gas is increased based on both a supply period and supply amount of the chemical liquid from the chemical liquid tank, even if the supply period and the supply amount are deviated from each other, such an error can be corrected. Therefore, a concentration of the process liquid to be supplied to the process vessel can be prevented from lowering. Further, the process liquid of a desired amount can be precisely supplied.

DETAILED DESCRIPTION OF THE PREFERRED EMBODIMENT

A concrete structure of a substrate process system provided with a process liquid supply system according to the present invention will be described in detail with reference to the accompanying drawings. Given herein as an example to describe the present invention is a case where the process liquid supply system is applied to a substrate process system (substrate cleaning system) for cleaning a wafer as an object to be processed.

Figure 1:
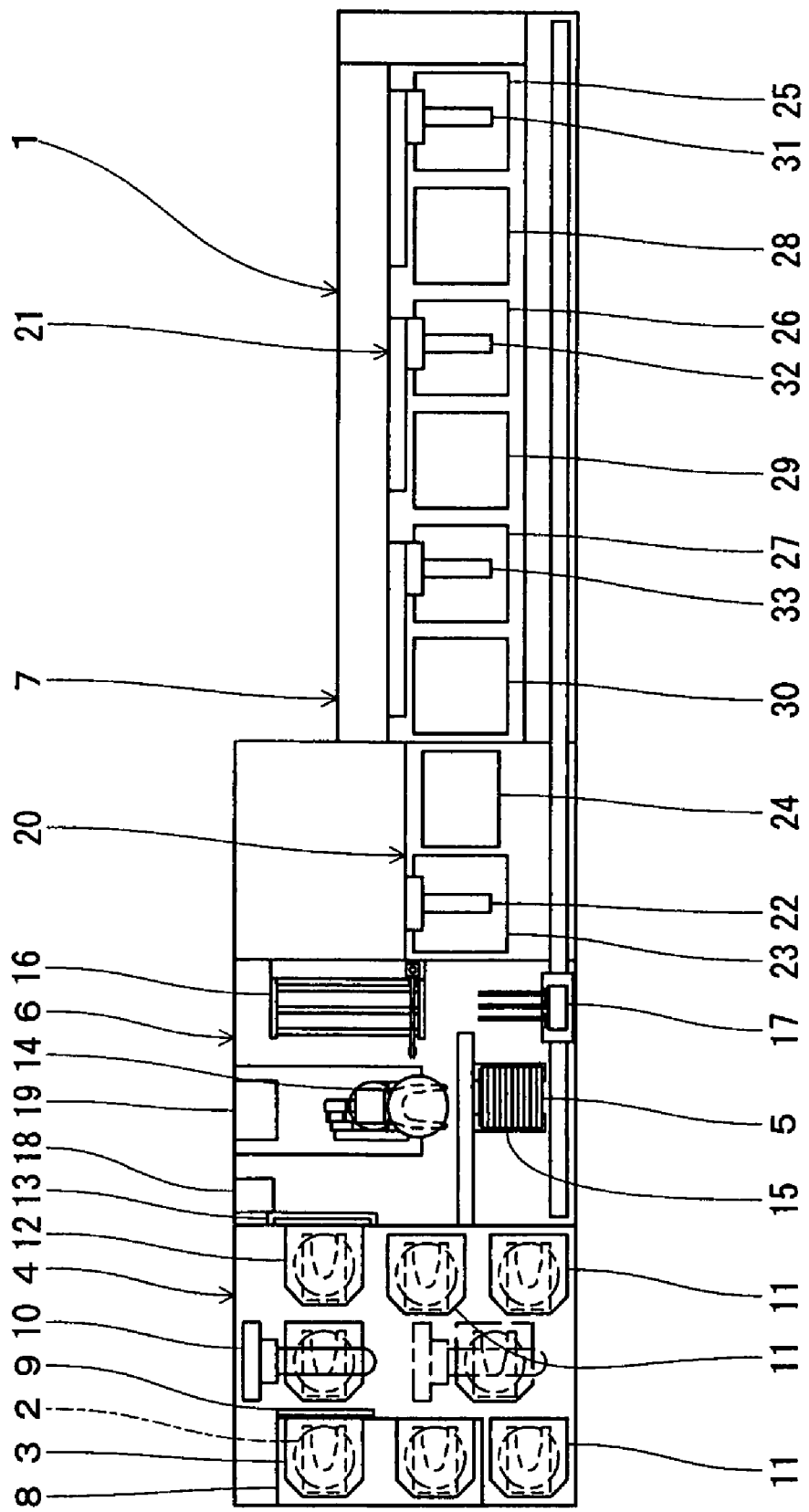
FIG. 1 is a plan view of a substrate process system including a process liquid supply system according to the present invention.

As shown in FIG. 1, a substrate process system 1 includes: a carrier loading/unloading part 4 that loads and/or unloads a plurality of carriers 3 each containing a plurality of wafers 2 (substrates); a batch forming part 6 that forms a batch 5 to be collectively processed by combining the wafers 2 contained in the carriers 3; and a substrate processing part 7 that cleans and dries the wafers 2 in each batch 5.

The carrier loading/unloading part 4 has a carrier stage 8 on which the carriers 3 are placed, and a sealing door 9 formed on the stage 8. A carrier transfer system 10 is disposed inside the door 9. When the wafers 2 are loaded, the carrier transfer system 10 transfers the carrier 3 placed on the carrier stage 8 to a carrier stock 11 where the carrier 3 is temporarily stored if necessary, and transfers the carrier 3 to a carrier table 12.

In the carrier loading/unloading part 4, the carrier 3 containing the wafers 2, which have been subjected to a series of process in the substrate processing part 7, is transferred by the carrier transfer system 10 to the carrier stock 11 where the carrier 3 is temporarily stored if necessary, and is transferred to the carrier stage 8, which is the reversing steps carried out when the carrier 3 is loaded.

In the batch forming part 6, a sealing door 13 is formed between the batch forming part 6 and the carrier loading/unloading part 4. Inside the door 13, the batch forming part 6 has: a substrate transfer system 14 that simultaneously transfer the wafers 2 contained in the carrier 3; a batch forming system 15 that forms the batch 5 out of the wafers 2 by reducing to half a gap between the adjacent wafers 2 which have been transferred by the substrate transfer system 14; and a substrate relative positional relationship changing system 16 that changes positional relationships of the wafers 2 relative to each other. The batch forming part 6 has a batch transfer system 17 that transfers the batch 5 which has been formed by the batch forming system 15 between the batch forming part 6 and the substrate processing part 7, and transfers the batch 5 inside the substrate processing part 7. The batch forming part 6 has a contained wafer condition detecting sensor 18 that detects conditions of the wafers 2 contained in the carrier 3, and a notch aligner 19 that adjusts in position notches (cutouts) of the wafers 2 contained in the carrier 3.

To be specific, in the batch forming part 6, the batch 5 of the wafers 2 is formed by combining the wafers 2 contained in the carriers 3 loaded by the carrier loading/unloading part 4. For example, the batch 5 of the fifty wafers 2 is formed by combining the twenty-five wafers 2 contained in the two carriers 3. In the batch forming part 6, the batch 5 is transferred to the substrate processing part 7. After the batch 5 is subjected to a process in the substrate processing part 7, the batch forming part 6 receives the batch 5 from the substrate processing part 7, arranges the wafers 2 in the original carrier 3, and transfers the carrier 3 to the carrier loading/unloading part 4.

The substrate processing part 7 has a cleaning and drying system 20 that cleans and dries the wafers 2, and a cleaning system 21 that cleans the wafers 2. In the cleaning and drying system 20, there are arranged in parallel a cleaning and drying unit 23 that cleans and dries the batch 5 by vertically moving the same by an elevating apparatus 22, and a transfer system cleaning unit 24 that cleans the batch transfer system 17. The cleaning system 21 is provided with: a first to a third chemical liquid process vessels 25, 26, and 27 for processing the batch 5 with a chemical liquid; a first to a third pure water process vessels 28, 29, and 30 for processing the batch 5 with a pure water; and a first to a third transfer apparatuses 31, 32, and 33 for transferring the batch 5 between the first to third chemical liquid process vessels 25, 26, and 27 and the first to third pure water process vessels 28, 29, and 30, respectively.

The batch transfer system 17 extends along the cleaning and drying system 20 and the cleaning system 21 in a right and left direction of FIG. 1. A starting end of the batch transfer system 17 is disposed in the batch forming part 6.

In the substrate processing part 7, the batch 5 formed by the batch forming part 6 is transferred by the batch transfer system 17 to the elevating apparatus 22 in the cleaning and drying system 20, and the first to third transfer apparatuses 31, 32, and 33 in the cleaning system 21. Each batch 5 of wafers 2 is processed in the cleaning and drying system 20 and the cleaning system 21. Then, the processed batch 5 is conveyed from the elevating apparatus 22 in the cleaning and drying system 20 and the first to third transfer apparatuses 31, 32, and 33 in the cleaning system 21 to the batch transfer system 17. The batch transfer system 17 transfers the batch 5 again to the batch forming part 6.

As described above, in the substrate processing system 1, the wafers 2 contained in each carrier 3 are loaded by the carrier loading/unloading part 4 into the batch forming part 6 in which the batch 5 to be collectively processed is formed. The batch 5 is delivered to the substrate processing part 7 in which the wafers 2 in each of the batches 5 are collectively processed. In the substrate processing system 1, the processed batch 5 is delivered again to the batch forming part 6 in which the wafers 2 constituting the batch 5 are received again in the carrier 3. The carrier 3 containing the processed wafers 2 is transferred to the carrier loading/unloading part 4 which then unloads the carrier 3.

Next, a structure of the process liquid supply system 34, which is a main part of the present invention, will be described. In the following description, the process liquid supply system 34 is applied to the first chemical liquid process vessel 25, by way of example. However, not limited thereto, the process liquid supply system 34 may be applied to the second and third chemical liquid process vessels 26 and 27 and the substrate cleaning and drying unit 23.

Figure 2:
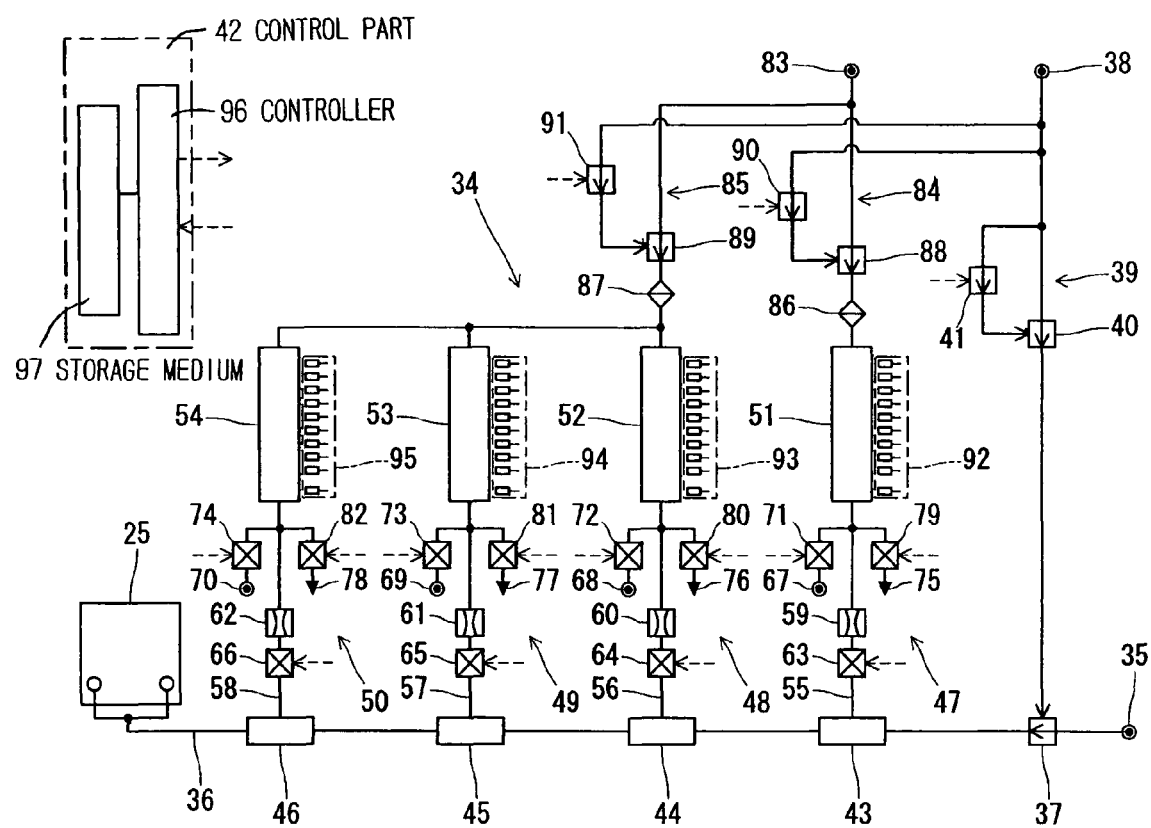
FIG. 2 is a block diagram showing a structure of the process liquid supply system of the present invention.

As shown in FIG. 2, in the process liquid supply system 34, a pure water supply source 35 for supplying a pure water is connected to the first chemical liquid process vessel 25 through a supply pipe 36. An outside pilot-operated regulator 37 is located in the supply pipe 36. A compressed air supply source 38 for supplying a compressed air is connected to the regulator 37 as an outside pilot of the regulator 37 through a pressure adjusting system 39. In the pressure adjusting system 39, a regulator 40 is disposed between the compressed air supply source 38 and the regulator 37. An electro-pneumatic regulator 41 is connected to the regulator 40 as an outside pilot of the regulator 40. Operations of the electro-pneumatic regulator 41 is controlled by a control part 42.

In the process liquid supply system 34, an output pressure of the regulator 40 is adjusted by adjusting an output pressure of the electro-pneumatic regulator 41 by the control part 42. Thus, a flow rate of a pure water flowing from the outside pilot-operated regulator 37 located in the supply pipe 36 can be adjusted.

In the process liquid supply system 34, there are located in the supply pipe 36 a mixing valve 43 for hydrogen peroxide, a mixing valve 44 for ammonia, a mixing valve 45 for hydrochloric acid, and a mixing valve 46 for hydrogen fluoride.

Chemical liquid supply systems 47 to 50 for supplying corresponding chemical liquids are connected to the mixing valves 43 to 46, respectively.

In the respective chemical liquid supply systems 47 to 50, the mixing valves 43 to 46 are connected to lower ends of chemical liquid tanks 51 to 54 through chemical liquid supply pipes 55 to 57, respectively. Orifices 59 to 62 and electromagnetic on-off valves 63 to 66 are located in the respective chemical liquid supply pipes 55 to 58. Chemical liquid supply sources 67 to 70 for supplying the respective chemical liquids are connected to the chemical liquid supply pipes 55 to 58 through electro-magnetic on-off valves 71 to 74, respectively. Drains 75 to 78 are connected to the chemical liquid supply pipes 55 to 58 through electro-magnetic on-off valves 79 to 82, respectively.

In the chemical liquid supply systems 47 to 50, a compressed gas supply source 83 for supplying a compressed gas (nitrogen gas) is connected to upper ends of the respective chemical liquid tanks 51 to 54 through pressure adjusting systems 84 and 85 and filters 86 and 87. In the respective pressure adjusting systems 84 and 85, outside pilot-operated regulators 88 and 89 are disposed between the compressed gas supply source 83 and the chemical liquid tanks 51 to 54. The compressed air supply source 38 is connected to the regulators 88 and 89 through electro-pneumatic regulators 90 and 91 as outside pilots of the respective regulators 88 and 89. Operations of the regulators 90 and 91 are controlled by the control part 42.

In the chemical liquid supply systems 47 to 50, supply amount sensors 92 to 95 are attached to the chemical liquid tanks 51 to 54, respectively. The respective supply amount sensors 92 to 95 are composed of a plurality of liquid level sensors which are attached to peripheral walls of the respective chemical liquid tanks 51 to 54, with spaces between the liquid level sensors in a vertical direction. The supply amount sensors 92 to 95 are connected to the control part 42.

The respective chemical liquid tanks 51 to 54, which are formed of longitudinally elongated containers made of resin, are reinforced by reinforcement rings fixed thereto. Since cross-sections of the chemical liquid tanks 51 to 54 are reduced as much as possible to increase flow-down speeds of the chemical liquids, detecting precisions of the liquid level sensors of the supply amount sensors 92 to 95 can be improved.

The chemical liquid supply systems 47 to 50 are respectively adapted to supply to the mixing valves 43 to 46 the chemical liquids (hydrogen peroxide, ammonia, hydrochloric acid, and hydrogen fluoride) stored in the respective chemical liquid tanks 51 to 54 by a pressure of the compressed gas supplied from the compressed air supply source 38. The control part 42 adjusts the electro-pneumatic regulators 90 and 91 to adjust the outside pilot-operated regulators 88 and 89, so that pressures and supply amounts of the chemical liquids supplied from the chemical liquid tanks 51 to 54 to the mixing valves 43 and 46 can be adjusted.

Since the chemical liquid supply systems 47 to 50 are combined to selectively open the electro-magnetic valves 71 to 74, one of the chemical liquids, or two or more chemical liquids can be supplied.

In this manner, while the process liquid supply system 34 adjusts a supply amount of the pure water by the pressure adjusting system 39, the process liquid supply system 34 adjusts supply amounts of the respective chemical liquids by the pressure adjusting systems 84 and 85. Thus, the pure water of a predetermined flow rate and the chemical liquids of predetermined flow rates are supplied to the respective mixing valves 43 to 46 at a predetermined ratio to thereby produce a process liquid by diluting the chemical liquids with the pure water at a predetermined concentration. The process liquid thus produced is then supplied to the first chemical liquid process vessel 25.

In the process liquid supply system 34, the pressure adjusting system 84 is independently connected to the chemical liquid supply system 47 for hydrogen peroxide, while the pressure adjusting system 85 is commonly connected to the chemical liquid supply systems 48 to 50 for ammonia, hydrochloric acid, and hydrogen fluoride. This is because, since there is no occasion that ammonia, hydrochloric acid, and hydrogen fluoride are mixed to be used, the single pressure adjusting system 85 is sufficient for the respective chemical liquid supply systems 48 to 50. Due to the common pressure adjusting system 85, the number of constituent parts can be decreased, which leads to a lower manufacturing cost and a simple maintenance operation.

Operations of the process liquid supply system 34 as structured above is controlled by the control part 42. The control part 42 can communicate with a host computer which is separated from the substrate process system 1 so as to control not only operations of the process liquid supply system 34 but also operations of the respective parts of the substrate process system 1. The control part 42 is formed of a controller 96 as a CPU and a storage medium 97 connected to the controller 96. The storage medium 97 stores various set data and a process liquid supply program 98 (see, FIG. 3). The storage medium 97 may be a memory such as a ROM and RAM, or a disc-shaped storage medium such as a hard disc and a CD-ROM.

As described below, the control part 42 controls the process liquid supply system 34 in accordance with the process liquid supply program 98 stored in the storage medium 97. Thus, the substrate process system 1 can accomplish the process liquid supply method. In the following description, a process liquid produced by diluting hydrogen peroxide with a pure water is supplied to the chemical liquid process vessel 25, by way of example.

Figure 3:
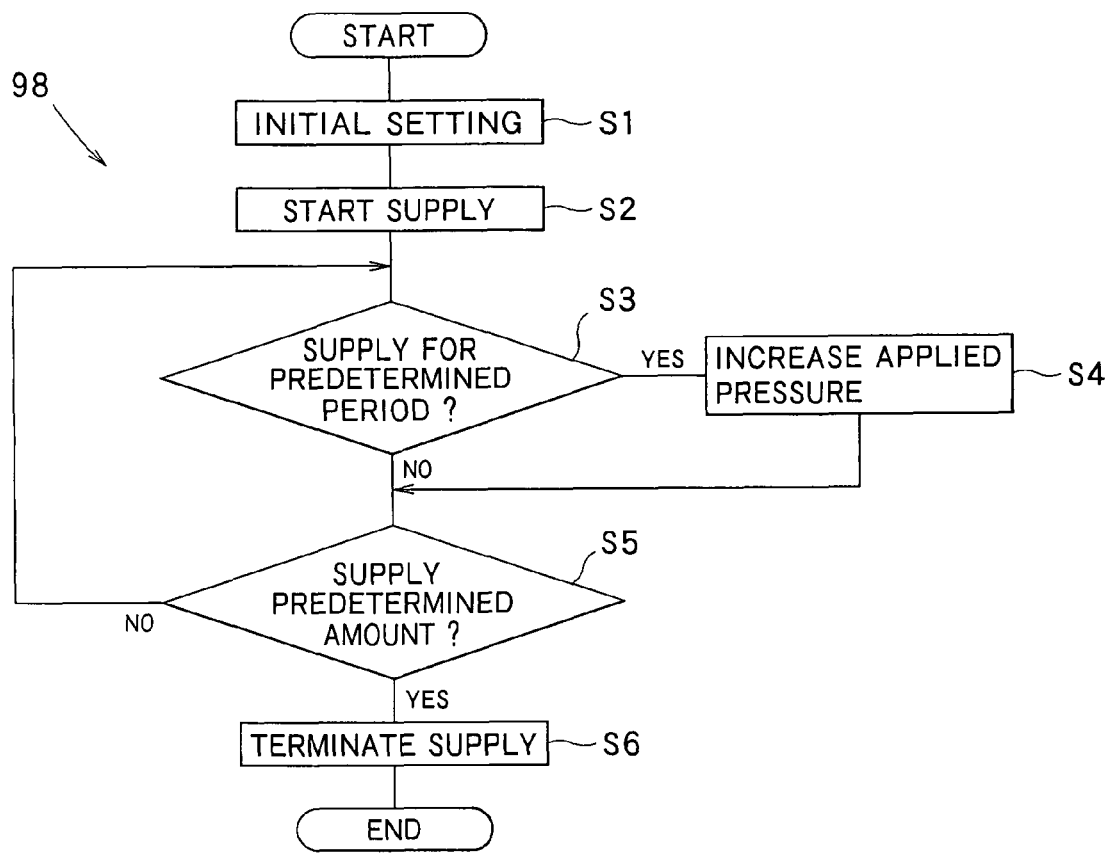
FIG. 3 is a flowchart showing a process liquid supply program for controlling the process liquid supply system shown in FIG. 2 to accomplish a process liquid supply method.
Figure 4:
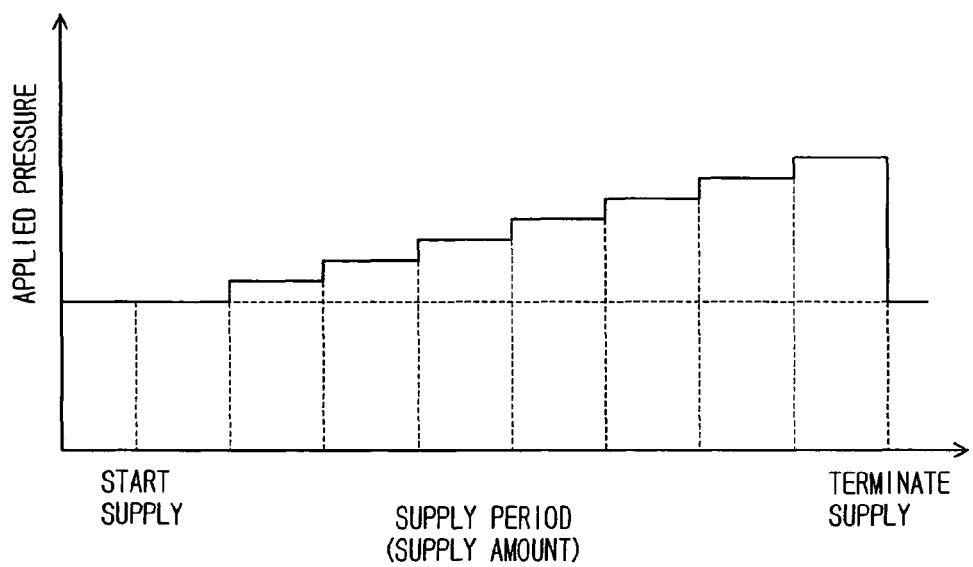
FIG. 4 is a graph schematically showing an increase in pressure of a compressed gas, when the pressure is increased based on a supply period (or supply amount) of a chemical liquid.

As shown in FIGS. 3 and 4, in the process liquid supply program 98, an initial setting of the process liquid supply system 34 is performed (initial setting step S1).

To be specific, the control part 42 closes the electro-magnetic on-off valves 63, 71, and 79, and adjusts the electro-pneumatic regulator 90 to supply a compressed air of a predetermined pressure to the outside pilot-operated regulator 88 and to supply a compressed gas of a predetermined pressure from the compressed gas supply source 83 to the chemical liquid tank 51. At this time, if the chemical liquid leaks from the chemical liquid tank 51, the electro-magnetic on-off valves 63, 71, 79, or the orifice 59, such a leakage is detected and an alarm is given.

An initial pressure of the compressed gas is changed based on a concentration at which the chemical liquid is diluted with a pure water. For example, an initial pressure when a mixing ratio between the chemical liquid and the pure water is 1:100 is set twice as high as an initial pressure when a mixing ratio is 1:300.

Alternatively, an initial pressure of the compressed gas may be changed based on a height of a liquid level of the chemical liquid detected by the supply amount sensor 92 attached on the chemical liquid tank 51. For example, an initial pressure when a liquid level of the chemical liquid stored in the chemical liquid tank 51 is 300 mm in height is set twice as high as an initial pressure when a liquid level of the chemical liquid is 100 mm in height.

Thereafter, the control part 42 opens the electro-magnetic on-off valve 79 for a certain period of time to discharge a part of the chemical liquid stored in the chemical liquid tank 51 through the drain 75, in order that bubbles in the flow channel can be discharged outside.

Thereafter, the control part 42 opens the electro-magnetic valve 71 to additionally supply a chemical liquid from the chemical liquid supply source 67 to the chemical liquid tank 51. When the supply amount sensor 92 detects that a suitable amount of chemical liquid has been supplied, the electro-magnetic on-off valve 71 is closed.

Then, the process liquid supply program 98 starts a supply of the chemical liquid by the process liquid supply system 34 (supply starting step S2).

To be specific, the control part 42 opens the electro-magnetic on-off valve 63 to supply the chemical liquid in the chemical liquid tank 51 to the mixing valve 43 through the chemical liquid supply pipe 55.

Thus, a pure water of a predetermined flow rate and the chemical liquid of a predetermined flow rate are flown into the mixing valve 43 at a predetermined ratio and mixed therein. Thus, the chemical liquid is diluted with the pure water at a predetermined concentration to produce a process liquid. The thus produced process liquid is supplied to the first chemical liquid process vessel 25 through the supply pipe 36.

Then, the process liquid supply program 98 judges whether a predetermined period of time has been elapsed or not from a time point when the supply of the chemical liquid was started or from a time point when a pressure was increased, which is described herebelow (time judging step S3).

To be specific, the control part 42 measures an elapse of time by means of a built-in timer from a time point when the supply starting step S2 is conducted or an applied pressure increasing step S4 described herebelow is conducted. Comparing the elapsed time with a previously set time, the control part 42 makes a judgment.

When it is judged that a predetermined time has elapsed in the time judging step S3, the process liquid supply program 98 increases a pressure of the compressed gas (applied pressure increasing step S4).

To be specific, the control part 42 adjusts the electro-pneumatic regulator 90 to increase a pressure of a compressed air supplied to the outside pilot-operated regulator 88. At the same time, the control part 42 increases a pressure of the compressed gas supplied from the compressed gas supply source 83 to the chemical liquid tank 51.

Then, the process liquid supply program 98 judges whether the chemical liquid of a predetermined flow rate has been supplied or not (predetermined supply amount judging step S5).

To be specific, the supply amount sensor 92 detects whether a liquid level of the chemical liquid remaining in the chemical liquid tank 51 is lowered or not to a position detected by the liquid level sensor on a predetermined position.

When the chemical liquid of a predetermined flow rate is not yet supplied, the process liquid supply program 98 returns to the time judging step S3, and repeats the time judging step S3, the applied pressure increasing step S4, and the predetermined supply amount judging step S5. On the other hand, when it is judged that the chemical liquid of a predetermined flow rate has been supplied, the supply of the chemical liquid is terminated (supply terminating step S6).

To be specific, the control part 42 closes the electro-magnetic on-off valve 63 to stop the supply of the chemical liquid from the chemical liquid tank 51 to the mixing valve 43.

As shown in FIG. 4, while the process liquid supply program 98 conducts the applied pressure increasing step S4 at every elapse of the predetermined time from the start of the supply of the chemical liquid so as to increase in a stepwise manner a pressure of the compressed gas to be supplied to the chemical liquid tank 51, the chemical liquid is mixed and diluted with the pure water to produce a process liquid. The thus produced process liquid is then supplied to the first chemical liquid process vessel 25.

In the above example, the process liquid supply program 98 increases a pressure of the compressed gas in a stepwise manner, with relatively a longer interval between the applied pressure increasing steps S4. However, by reducing an interval between the applied pressure increasing steps S4, a pressure of the compressed gas can be substantially linearly (gradually) increased.

Figure 5:
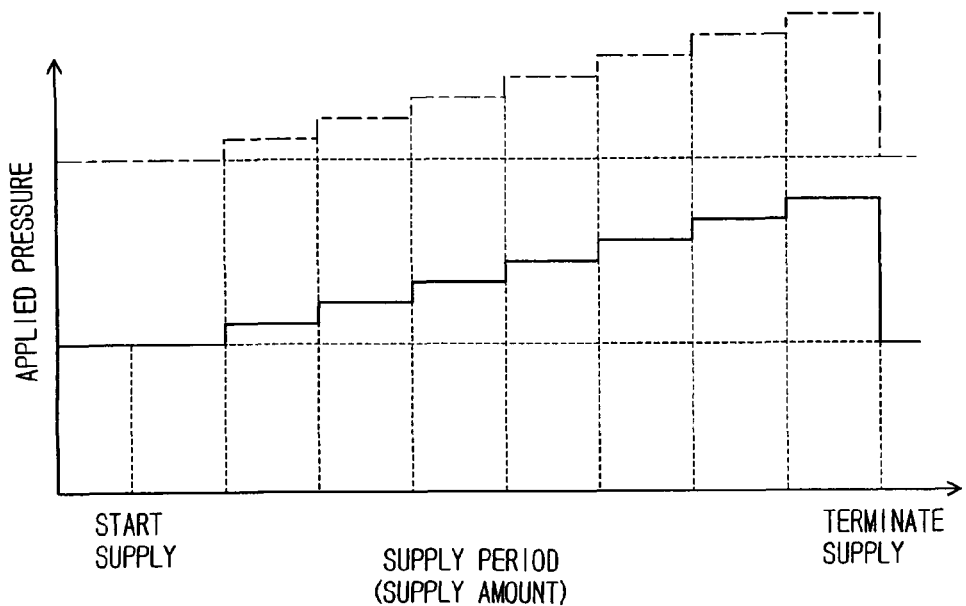
FIG. 5 is a graph schematically showing an increase in pressure of the compressed gas, when an initial pressure of the compressed gas is changed.

In the initial setting step S1, the process liquid supply system 98 changes an initial pressure of the compressed gas based on a concentration at which the chemical liquid is diluted with a pure water. FIG. 5 schematically shows an increase in pressure of the compressed gas, in which the solid line indicates a case in which a mixing ratio between the chemical liquid and a pure water is 1:100, and the chain lines indicates a case in which a mixing ratio is 1:300. In the initial setting step S1, when an initial pressure of the compressed gas is changed based on a height of a liquid level of the chemical liquid stored in the chemical liquid tank 51, a pressure of the compressed gas also increases in the manner schematically shown in FIG. 5.

In the above process liquid supply program 98, whether a predetermined time has been elapsed or not from a time point when the supply of the chemical liquid was started or a pressure was increased is judged in the time judging step S3, and the applied pressure increasing step S4 is performed at every elapse of the predetermined time. Alternatively, the applied pressure increasing step S4 may be performed at every timing when a predetermined amount of chemical liquid is supplied, by using the supply amount sensor 92 with the liquid level sensors that detect whether a predetermined amount of chemical liquid is supplied or not.

Figure 6:
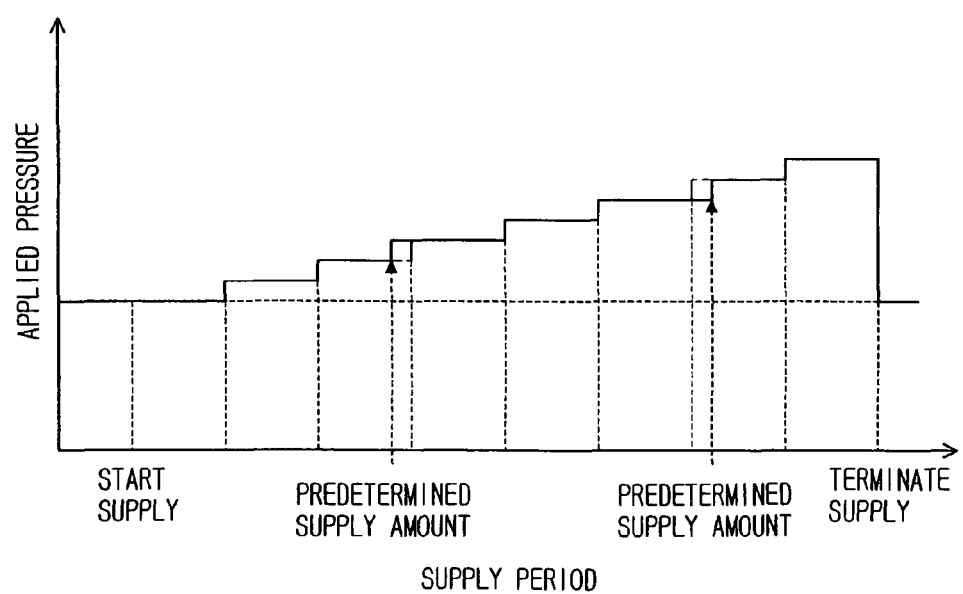
FIG. 6 is a graph schematically showing an increase in pressure of the compressed gas, when the pressure of the compressed gas is increased based on both a supply amount and a supply period of the chemical liquid.

Alternatively, a pressure of the compressed gas may be increased based on both the supply amount and the supply period of the chemical liquid. In this case, it is possible to eliminate errors which may sometimes occur although the supply amount of the chemical liquid is substantially proportional to the supply period thereof. For example, as schematically shown in FIG. 6, a pressure of the compressed gas supplied from the compressed gas supply source 83 to the chemical liquid tank 51 is basically increased by a predetermined amount, every time when a supply period of the chemical liquid from the chemical liquid tank 51 to the chemical liquid supply pipe 55 reaches an integral multiple of a previously set period. However, when it is judged that, immediately before or after the certain supply period reaches an integral multiple of the previously set period, a supply amount of the chemical liquid reaches an integral multiple of a previously set amount, a timing for increasing a pressure of the compressed gas is temporarily changed, from a timing when the supply period of the chemical liquid reaches an integral multiple of the previously set period, to a timing when the supply amount of the chemical liquid reaches an integral multiple of the previously set amount.

As has been described above, in the substrate process system 1, a pressure of the compressed gas is increased after the supply of the chemical liquid is started. Thus, even when the chemical liquid inside each of the chemical liquid tanks 51 to 54 is gradually decreased with the supply of each chemical liquid so that a pressure corresponding to a weight of the chemical liquid is lowered, a decrease in pressure acting on the chemical liquid can be restrained by gradually or stepwise increasing a pressure of the compressed gas. Therefore, lowering of a supply amount of the chemical liquid caused by a reduction in pressure can be prevented, and thus lowering of a concentration of a process liquid can be prevented.

Specifically, in the substrate processing system 1, a pressure of the compressed gas is increased in a stepwise manner based on a supply period of the chemical liquid from the start of the supply thereof. Therefore, it is unnecessary to additionally dispose a pressure sensor. In addition, with the smaller number of liquid level sensors attached to the chemical liquid tanks 51 to 54, a concentration of the process liquid can be prevented from lowering by merely setting a given time interval.

Alternatively, when a pressure of the compressed gas is increased in a stepwise manner based on a supply amount of the chemical liquid from the start of the supply thereof, it is unnecessary to additionally dispose a pressure sensor. A concentration of the process liquid can be prevented from lowering. Further, the process liquid of a desired amount can be precisely supplied.

Alternatively, when a pressure of the compressed gas is increased in a stepwise manner based on both a supply period and supply amount of the chemical liquid from the start of the supply thereof, even if the supply period and the supply amount are deviated from each other, such an error can be corrected. Therefore, a concentration of the process liquid can be prevented from lowering. Further, the process liquid of a desired amount can be precisely supplied.

When an initial pressure of the compressed gas is changed based on a concentration at which the chemical liquid is diluted with a pure water, it is unnecessary to dispose a channel (orifice, on-off valve, and so on) corresponding to a diluted concentration. Thus, the number of constituent parts can be decreased, which leads to a lower manufacturing cost and a simple maintenance operation.

Alternatively, it is possible to change an initial pressure of the compressed gas based on a height of a liquid level of the chemical liquid stored in the chemical liquid tank 51. In this case, even when the height of the liquid level of the chemical liquid differs depending on each of the chemical liquid tanks 51, a pressure acting on the chemical liquid can be substantially constantly maintained, by changing an initial pressure of the compressed gas based on the height of the liquid level. Therefore, lowering of a supply amount of the chemical liquid caused by a reduction in pressure can be prevented, and thus lowering of a concentration of a process liquid can be prevented.

The invention claimed is:

1. A process liquid supply system for supplying to a process vessel a process liquid formed by diluting a chemical liquid with a pure water, the process liquid supply system consisting essentially of:
   a pure water supply source connected to the process vessel through a supply pipe;
   a chemical liquid tank that stores a chemical liquid and supplies the chemical liquid stored therein to the supply pipe;
   a compressed gas supply source connected to the chemical liquid tank through a compressed gas supply pipe, the compressed gas supply source supplying a compressed gas to the chemical liquid tank to supply the chemical liquid from the chemical liquid tank to the supply pipe;
   a pressure adjusting part disposed on the compressed gas supply pipe at a position between the compressed gas supply source and the chemical liquid tank, the pressure adjusting part adjusting a pressure of the compressed gas supplied from the compressed gas supply source; and
   a control part that controls the pressure adjusting part based on elapsed time in a supply period and/or remaining amount of chemical in the chemical liquid tank and by continuously increasing the pressure of the compressed gas supplied from the compressed gas supply source to the chemical liquid tank gradually or in a stepwise manner regardless of the pressure of the chemical liquid tank after the supply of the chemical liquid from the chemical liquid tank to the supply pipe is started to avoid lowering of the processing liquid concentration.

2. The process liquid supply system according to claim 1, wherein the control part is configured to assess the remaining chemical liquid based on the height of a liquid level of the chemical liquid stored in the chemical liquid tank before the supply of the chemical liquid is started.

3. The process liquid supply system according to claim 1, wherein the control part is configured to previously set, based on a ratio of the diluted chemical liquid relative to the process liquid, an initial pressure which is a pressure of the compressed gas supplied from the compressed gas supply source to the chemical liquid tank immediately after the supply of the chemical liquid from the chemical liquid tank to the supply pipe is started.

4. The process liquid supply system according to claim 1, wherein the control part controls the pressure adjusting part-based on a supply period of the chemical liquid supplied from the chemical liquid tank to the supply pipe.

5. The process liquid supply system according to claim 4, wherein the control part controls the pressure adjusting part to increase pressure by a predetermined amount, every time when the supply period of the chemical liquid from the chemical liquid tank to the supply pipe reaches an integral multiple of a previously set period.

6. The process liquid supply system according to claim 1, wherein the control part controls the pressure adjusting part based on a supply amount of the chemical liquid supplied from the chemical liquid tank to the supply pipe.

7. The process liquid supply system according to claim 6, wherein the control part controls the pressure adjusting part to increase the pressure by a predetermined amount, every time when the supply amount of the chemical liquid from the chemical liquid tank to the supply pipe reaches an integral multiple of a previously set amount.

8. The process liquid supply system according to claim 1, wherein the control part controls the pressure adjusting part-based on both a supply period and a supply amount of the chemical liquid supplied from the chemical liquid tank to the supply pipe.

9. The process liquid supply system according to claim 8, wherein the control part controls the pressure adjusting part in such a manner that a pressure of the compressed gas supplied from the compressed gas supply source to the chemical liquid tank is increased by a predetermined amount, every time when the supply period of the chemical liquid from the chemical liquid tank to the supply pipe reaches an integral multiple of a previously set period, but when it is judged that the supply amount of the chemical liquid reaches an integral multiple of a previously set amount immediately before or after the certain supply period reaches an integral multiple of the previously set period, a timing for increasing a pressure of the compressed gas is temporarily changed, from a timing when the supply period of the chemical liquid reaches an integral multiple of the previously set period, to a timing when the supply amount of the chemical liquid reaches an integral multiple of the previously set amount.

10. A process liquid supply method for supplying to a process vessel a process liquid formed by diluting a chemical liquid with a pure water, the process liquid supply method comprising the steps of:
    supplying a chemical liquid from a chemical liquid tank storing the chemical liquid to a supply pipe connected to a process vessel, by supplying a compressed gas to the chemical liquid tank;
    diluting the chemical liquid supplied from the chemical liquid tank to the supply pipe, by supplying a pure water to the supply pipe; and
    gradually or stepwise continuously increasing a pressure of the compressed gas supplied to the chemical liquid tank regardless of the pressure of the chemical liquid tank, after the supply of the chemical liquid from the chemical liquid tank to the supply pipe is started, based on elapsed time in a supply period and/or remaining amount of chemical in the chemical liquid tank to avoid lowering of the processing liquid concentration.

11. The process liquid supply method according to claim 10, wherein an initial pressure, which is a pressure of the compressed gas supplied from the compressed gas supply source to the chemical liquid tank immediately after the supply of the chemical liquid from the chemical liquid tank to the supply pipe is started, is previously set based on a height of a liquid level of the chemical liquid stored in the chemical liquid tank before the supply of the chemical liquid is started.

12. The process liquid supply method according to claim 10, wherein an initial pressure, which is a pressure of the compressed gas supplied from the compressed gas supply source to the chemical liquid tank immediately after the supply of the chemical liquid form the chemical liquid tank to the supply pipe is started, is previously set based on a ratio of the diluted chemical liquid relative to the process liquid.

13. The process liquid supply method according to claim 10, wherein, in the step of gradually or stepwise increasing a pressure of the compressed gas supplied to the chemical liquid tank, a pressure of the compressed gas supplied from the compressed gas supply source to the chemical liquid tank is gradually or stepwise increased, based on a supply period of the chemical liquid supplied from the chemical liquid tank to the supply pipe.

14. The process liquid supply method according to claim 13,
wherein a pressure of the compressed gas supplied from the compressed gas supply source to the chemical liquid tank is increased by a predetermined amount, every time when the supply period of the chemical liquid from the chemical liquid tank to the supply pipe reaches an integral multiple of a previously set period.

15. The process liquid supply method according to claim 10,
wherein, in the step of gradually or stepwise increasing a pressure of the compressed gas supplied to the chemical liquid tank, a pressure of the compressed gas supplied from the compressed gas supply source to the chemical liquid tank is gradually or stepwise increased, based on a supply amount of the chemical liquid supplied from the chemical liquid tank to the supply pipe.

16. The process liquid supply method according to claim 15,
wherein a pressure of the compressed gas supplied from the compressed gas supply source to the chemical liquid tank is increased by a predetermined amount, every time when the supply amount of the chemical liquid from the chemical liquid tank to the supply pipe reaches an integral multiple of a previously set amount.

17. The process liquid supply method according to claim 10,
wherein, in the step of gradually or stepwise increasing a pressure of the compressed gas supplied to the chemical liquid tank, a pressure of the compressed gas supplied from the compressed gas supply source to the chemical liquid tank is gradually or stepwise increased, based on both a supply period and a supply amount of the chemical liquid supplied from the chemical liquid tank to the supply pipe.

18. The process liquid supply method according to claim 17,
wherein a pressure of the compressed gas supplied from the compressed gas supply source to the chemical liquid tank is increased by a predetermined amount, every time when the supply period of the chemical liquid from the chemical liquid tank to the supply pipe reaches an integral multiple of a previously set period, but when it is judged that the supply amount of the chemical liquid reaches an integral multiple of a previously set rate immediately before or after the certain supply period reaches an integral multiple of the previously set period, a timing for increasing a pressure of the compressed gas is temporarily changed, from a timing when the supply period of the chemical liquid reaches an integral multiple of the previously set period, to a timing when the supply amount of the chemical liquid reaches an integral multiple of the previously set rate.

19. A computer readable storage medium including a program for controlling a process liquid supply system for supplying to a process vessel a process liquid formed by diluting a chemical liquid with a pure water to accomplish a process liquid supply method comprising:
a step of supplying a chemical liquid from a chemical liquid tank storing the chemical liquid to a supply pipe connected to a process vessel, by supplying a compressed gas to the chemical liquid tank;
a step of diluting the chemical liquid supplied from the chemical liquid tank to the supply pipe, by supplying a pure water to the supply pipe; and
a step of gradually or stepwise continuously increasing a pressure of the compressed gas supplied to the chemical liquid tank regardless of the pressure of the chemical liquid tank, after the supply of the chemical liquid from the chemical liquid tank to the supply pipe is started, based on elapsed time in a supply period and/or remaining amount of chemical in the chemical liquid tank to avoid lowering of the processing liquid concentration.

* * * * *